United States Patent [19]

Cordoba et al.

[11] Patent Number: 5,412,257
[45] Date of Patent: * May 2, 1995

[54] HIGH EFFICIENCY N-CHANNEL CHARGE PUMP HAVING A PRIMARY PUMP AND A NON-CASCADED SECONDARY PUMP

[75] Inventors: Michael V. Cordoba; Kim C. Hardee, both of Colorado Springs, Colo.

[73] Assignees: United Memories, Inc., Colorado Springs, Colo.; Nippon Steel Semiconductor Corp., Chiba, Japan

[*] Notice: The portion of the term of this patent subsequent to Sep. 13, 2011 has been disclaimed.

[21] Appl. No.: 964,003

[22] Filed: Oct. 20, 1992

[51] Int. Cl.[6] .............................................. H03K 3/01
[52] U.S. Cl. .................................... 327/536; 327/537; 327/534
[58] Field of Search .............. 307/296.2, 296.5, 296.6, 307/296.1, 264, 296.8

[56] References Cited

U.S. PATENT DOCUMENTS

| | | | |
|---|---|---|---|
| 3,872,321 | 3/1975 | Matsue | 307/246 |
| 4,061,929 | 12/1977 | Asano | 307/246 |
| 4,336,466 | 6/1982 | Sud et al. | 307/296.2 |
| 4,382,194 | 5/1983 | Nakano et al. | 307/264 |
| 4,388,537 | 6/1983 | Kanuma | 307/296.6 |
| 4,578,597 | 3/1986 | Soneda et al. | 307/246 |
| 4,578,601 | 3/1986 | McAlister et al. | 307/246 |
| 4,581,546 | 4/1986 | Allan | 307/297 |
| 4,631,421 | 12/1986 | Inoue et al. | 307/296.2 |
| 4,633,106 | 12/1986 | Backes et al. | 307/578 |
| 4,638,464 | 1/1987 | Cranford, Jr. et al. | 365/226 |
| 4,705,966 | 11/1987 | Van Zanten | 307/296.6 |
| 4,731,552 | 3/1988 | Miyamoto | 307/264 |
| 4,733,108 | 3/1988 | Truong | 307/246 |
| 4,797,899 | 1/1989 | Fuller et al. | 375/7 |
| 4,843,256 | 6/1989 | Scade et al. | 307/296.2 |
| 4,883,976 | 11/1989 | Deane | 307/291.2 |
| 4,922,130 | 5/1990 | Swerlein | 307/296.5 |
| 4,984,256 | 1/1991 | Imai | 307/296.6 |
| 5,036,229 | 7/1991 | Tran | 307/497 |
| 5,041,739 | 8/1991 | Goto | 307/296.2 |
| 5,059,815 | 10/1991 | Bill et al. | 307/296.2 |
| 5,066,870 | 11/1991 | Kobatake | 307/264 |
| 5,103,191 | 4/1992 | Werker | 331/1 A |
| 5,113,088 | 5/1992 | Yamamoto et al. | 307/296.2 |
| 5,126,590 | 6/1992 | Chern | 307/296.8 |
| 5,162,668 | 11/1992 | Chen et al. | 307/296.8 |
| 5,172,013 | 12/1992 | Matsumura | 307/296.8 |
| 5,180,928 | 1/1993 | Choi | 307/296.6 |
| 5,184,030 | 2/1993 | Chung et al. | 307/296.8 |
| 5,196,996 | 3/1993 | Oh | 307/296.2 |
| 5,266,842 | 11/1993 | Park | 307/296.2 |

FOREIGN PATENT DOCUMENTS

| | | | |
|---|---|---|---|
| 0030856 | 6/1981 | European Pat. Off. . | |
| 0143157 | 6/1985 | European Pat. Off. | 307/296.2 |
| 0379454 | 7/1990 | European Pat. Off. . | |
| 0389846 | 10/1990 | European Pat. Off. | 307/296.2 |
| 0404124 | 12/1990 | European Pat. Off. | 307/296.1 |
| 0427084 | 5/1991 | European Pat. Off. | 307/296.4 |
| 0450796 | 10/1991 | European Pat. Off. . | |
| 0450797 | 10/1991 | European Pat. Off. | 307/296.2 |

OTHER PUBLICATIONS

Gillingham et al., "High-Speed, High-Reliability Circuit Design for Megabit DRAM," *IEEE Journal of Solid-State Circuits*, vol. 26, No. 8, pp. 1171-1175 (Aug. 1991).

Martino et al., "An On-Chip Back-Bias Generator for MOS Dynamic Memory," *IEEE Journal of Solid-State Circuits*, vol. SC-15, No. 5, pp. 820-825 (Oct. 1990).

Oto et al., "High-Voltage Regulation and Process Considerations for High-Density 5 V-only E$^2$PROMS's," *IEEE Journal of Solid-State Circuits*, vol. SC-18, No. 5, pp. 532-538 (Oct. 1983).

Glasser et al., "Substrate-bias generation," *Design and Analysis of VLSI Circuits*, chap. 5.8, pp. 301-308 (Addison-Wesley 1985).

Primary Examiner—Timothy P. Callahan
Assistant Examiner—T. T. Lam
Attorney, Agent, or Firm—Edward D. Manzo; David K. Lucente

[57] ABSTRACT

A high efficiency charge pump for low and wide voltage ranges. The charge pump includes main and secondary charge pumps, the secondary charge pump is employed to avoid the $Vt_N$ drop that the main charge pump exhibits. The secondary charge pump allows the main charge pump to pump to a theoretical maximum of 2 VCC, while maintaining an efficiency close to 40%.

29 Claims, 5 Drawing Sheets 5,412,257

HIGH EFFICIENCY N-CHANNEL CHARGE PUMP HAVING A PRIMARY PUMP AND A NON-CASCADED SECONDARY PUMP

FIELD OF THE INVENTION

The present invention relates to a charge pump for use in an integrated circuit and more particularly to a high-efficiency charge pump including two charge pumps that can obtain a voltage of 2 VCC.

BACKGROUND OF THE INVENTION

Some CMOS or MOS products require a charge pump circuit for such applications as programming or for speed enhancement. Charge pumps have been used in substrate bias generators, for example. Other examples of products where charge pumps are sometimes used include EEPROMs, DRAMs and SRAMs.

A Single Stage Prior Art Pump

Problems addressed by the present invention can be understood by first reviewing various prior art charge pumps and their shortcomings. FIG. 3 shows a single-stage, n-channel transistor, prior art charge pump. This is a single-stage pump because it uses only one pumping stage. The single-stage is defined by capacitor 64 being charged by VCC through transistor 62, and supplying charge to capacitive load 85. In FIG. 3, a charge pump 65 receives operating voltage VCC and several clock pulses CP1, CP2, and CP3. It uses them in various ways to affect a central internal circuit node 60, and it produces an output referred to in this illustration as VCCP, which can be understood as a voltage higher than VCC.

Briefly, a first node 60 is selectively coupled to VCC by a transistor 62 and selectively coupled by a transistor 70 to an output node 72. Node 60 is coupled to one side of a first capacitor 64. Clock input CP1 is applied to an inverter 66 having an output node 68 which is coupled to the other side of capacitor 64. Transistor 62 has a gate electrode which is selectively coupled to VCC by a transistor 74 having a source electrode coupled to a second node 76. Node 76 is coupled to both the gate electrode of transistor 62 and a second capacitor 78. A further transistor 80 has its gate electrode coupled to node 76, its drain coupled to VCC, and its source coupled at a third node 82 to a third capacitor 84. Node 82 is coupled to the gate electrode of transistor 70. Finally, capacitive load 85 is coupled between ground (VSS) and output node 72.

In operation, it will be understood that clock pulses CP1, CP2 and CP3 vary between 0 V and VCC as shown in FIGS. 4(a)–(c). Clock pulse $\overline{CP1}$ is an inverted clock pulse CP1. It will be understood that clock pulses CP1, CP2 and CP3, and times T1 to T6 are not the same as in the other figures. Clock pulses CP2 and CP3 are non-overlapping active high clocks. Prior to time T1 of FIG. 4(a), clock pulse CP2 is active (high) to couple node 60 to VCC through the source-drain path of transistor 62 as shown in FIG. 3. Capacitor 64 will be charged (explained infra) to VCC through the source-drain path of transistor 62. Node 60 will obtain a voltage VCC. In the meantime, still prior to time T1, clock pulse CP1 is supplied by inverter 66 to node 68, and is inactive (low). Inactive clock pulse CP1 will cause node 68 to have a voltage of 0 V. Therefore, capacitor 64 will charge to VCC, and there will be a voltage drop of VCC across capacitor 64 between node 60 (VCC) and node 68 (0 V).

In FIGS. 4(a) and (c), at a time T1 clock pulse CP2 transitions to an inactive state (low). Transistors 62 and 80 are turned off. At time T2, clock pulse CP1 transitions to an active state (high). Node 68 is then clamped to VCC through the external power supply connection of inverter 66. With node 68 having a voltage of VCC and capacitor 64 having a voltage drop of VCC, node 60 will be driven to a theoretical maximum 2 VCC when clock pulse CP1 becomes active (high). The theoretical maximum voltage at node 60 is a function of the capacitance of capacitor 64 and all other parasitic capacitances coupled to node 60. By making the capacitance of capacitor 64 larger than all other parasitic capacitances coupled to node 60, node 60 will approach 2 VCC. Parasitic capacitances are caused by transistors 62 and 70.

At a time T3, clock pulse CP3 transitions to an active state (high). Active clock pulse CP3 increases the voltage at node 82 (FIG. 3) to a theoretical maximum of 2 VCC, as long as the capacitance of capacitor 84 is much greater than the capacitance of the gate of transistor 70 and all other parasitic capacitances on that node. This couples node 72 having a capacitive load 85 through the source-drain path of transistor 70 to node 60. Node 72 initially has a voltage VCCP (VCCP <2 VCC), and will charge through the source-drain path of transistor 70 from capacitor 64 via node 60. The charge pumped into capacitive load 85 from node 60 will increase the voltage of node 72 and theoretically decrease the voltage of capacitor 64 the same amount, a voltage $\Delta V$. Thus, the voltage at node 60 has decreased to a theoretical voltage of 2 VCC minus $\Delta V$.

Prior to time T4 in FIGS. 4(b) and (c), clock pulses CP1 and CP3 transition inactive (low). After clock pulse CP3 transitions to an inactive state, transistor 70 (FIG. 3) is turned off and uncouples nodes 60 and 72. After clock pulse CP1 transitions to an inactive state (low), node 68 transitions from voltage VCC to voltage VSS (0 V). VSS is supplied through the ground connection of inverter 66. To maintain the voltage drop across capacitor 64 (VCC-$\Delta V$) after the voltage at node 68 becomes VSS, node 60 must decrease by the same voltage change as occurred on node 68 (VCC). When node 68 was high, node 60 had a voltage of 2 VCC minus $\Delta V$. The new voltage at node 60 after clock pulse CP1 transitions to an inactive state (low) becomes (2 VCC−$\Delta V$)−VCC, or VCC−$\Delta V$.

At time T4 (FIG. 4(a)), clock pulse CP2 transitions to an active state (high) which turns on transistor 62. Node 60 is then clamped to VCC through the source-drain path of transistor 62. Since VCC−$\Delta V$<VCC, capacitor 64 will charge through transistor 62 to VCC. At time T5, clock pulse CP2 transitions to an inactive state (low) to turn off transistor 62.

The above timing has a cycle time duration T6 as shown in FIGS. 4(a)–(c). The events during epoch T6 recur repetitively to charge node 72 having a capacitive load 85 to obtain a full charge.

However, the circuit in FIG. 3 does not charge the capacitive load 85 to a full 2 VCC. Referring to FIGS. 4(a)–(c), clock pulses CP2 and CP3 are non-overlapping when they are active (high). An active clock pulse CP3 turns transistor 74 on to clamp node 76 to VCC. Since clock pulse CP2 is inactive (low), the voltage drop across capacitor 78 is VCC−VSS(0 V), i.e. the voltage drop equals VCC. Capacitor 78 is charged to a voltage VCC.

Prior to clock pulse CP2 transitioning active (high) (FIG. 4(a)), clock pulse CP3 transitions to an inactive state (low) (FIG. 4(b)) which unclamps node 76 from VCC. To maintain the voltage drop of capacitor 78 after clock pulse CP2 transitions to an active state (high), node 76 will transition the same voltage as clock pulse CP2 (VCC−VSS), i.e. a VCC transition, if the capacitance of capacitor 78 is much greater than the gate capacitance of transistor 62 and all other parasitic capacitance on node 76. Node 76 now has a theoretical maximum voltage value of 2 VCC which is supplied to the gate electrode of transistor 62. Transistor 62 will be turned on since the gate voltage (2 VCC) is a threshold voltage $Vt_N$ greater than the voltage at node 60, which is a maximum of VCC when clock pulse CP1 is inactive (low). Further, node 60 (capacitor 64) will charge to a full VCC since the voltage of node 76 is a threshold voltage $Vt_N$ greater than the voltage at node 60 (VCC).

Active clock pulse CP2 also turns on transistor 80 which clamps node 82 to VCC. With clock pulse CP3 inactive (low), the voltage drop across capacitor 84 is VCC−VSS(0 V). Clock pulse CP2 subsequently transitions to an inactive state (low) to turn off transistors 62 and 80.

Clock pulse CP3 transitions to an active state (high) after clock pulse CP2 transitions to an inactive state (low) and clock pulse CP1 transitions to an active state (high). To maintain the voltage drop VCC−VSS(0 V) across capacitor 84, node 82 must also transition the same $\Delta V$ as clock pulse CP3. Therefore, the voltage of node 82 transitions from VCC to 2 VCC. The voltage 2 VCC at node 82 is supplied to the gate electrode of transistor 70 to turn it on, and couple node 60 to node 72. The voltage at node 60 is 2 VCC (CP1 active) and the voltage at node 72 is VCCP so node 72 charges through the source-drain path of transistor 70 from node 60 since 2 VCC>VCCP.

Each cycle (time duration T6 in FIG. 4) of the clock pulses CP1, CP2 and CP3 increases the voltage at node 72 by a voltage $\Delta V'$. To maintain transistor 70 on, the voltage at the gate of transistor 70 must be at least one threshold voltage greater than (since transistor 70 is a n-channel transistor) the voltage at node 72. But, because the voltage at the gate of transistor 70 does not go above a theoretical maximum 2 VCC, capacitive load 85 will charge only to a voltage 2 VCC minus $Vt_N$. Thus, node 72 with capacitance load 85 will never achieve a full 2 VCC. Understandably, this charge pump cannot be used where a full 2 VCC is required.

This charge pump circuit also has a maximum theoretical efficiency of 50% ($I_{VCCP}/I_{VCC}$).

A Prior Art Two-Stage Charge Pump

Another type of charge pump circuit is a dual-stage which contains all n-type devices. This circuit can obtain 2 VCC; however its maximum theoretical efficiency is typically 33%.

FIG. 5 shows a dual-stage, n-channel transistor pump circuit. One side of a capacitor 100 is coupled to receive a clock pulse CP1. The other side of capacitor 100 is coupled to a node 110. Node 110 is selectively coupled to a power supply providing a voltage VCC through a transistor 114. A gate electrode of transistor 114 is coupled to a node 112. Node 112 is selectively coupled to the power supply providing voltage VCC through transistor 117. Node 112 is coupled to a gate electrode of a transistor 116. Node 112 is coupled to one side of a capacitor 104. Another side of capacitor 104 is coupled to receive a clock pulse CP2.

Node 110 is selectively coupled to a node 122 through a transistor 120. A gate electrode of transistor 120 is coupled to a node 118. Node 118 is coupled to a gate electrode of transistor 117. Node 118 is selectively coupled to the power supply providing voltage VCC through transistor 116. Node 118 is coupled to a gate electrode of transistor 124. Node 118 is coupled to one side of a capacitor 106. Another side of capacitor 106 is coupled to receive a clock pulse CP3.

Node 122 is coupled to one side of a capacitor 102. Another side of capacitor 102 is coupled to receive a clock pulse CP1B. Node 122 is selectively coupled to a node 130 through a transistor 128. Node 130 has a capacitive load 131. Node 122 is selectively coupled to a node 126 through a transistor 124. Node 126 is coupled to a gate electrode of transistor 128. Node 126 is coupled to one side of a capacitor 108. Another side of capacitor 108 is coupled to receive clock pulse CP2.

A first stage of the FIG. 5 circuit comprises the devices on the left of line 132. The second stage comprises the devices on the right of line 132. The operation of the first stage of the FIG. 5 circuit is defined by capacitor 100 receiving charge from the power supply providing voltage VCC through transistor 114, and providing charge through transistor 120. The operation of the second stage is defined by capacitor 102 receiving charge through transistor 120 and providing charge through transistor 128 to node 130.

Clock pulses CP1, CP1B, CP2 and CP3 vary between 0 V (low) and VCC (high) as shown in FIGS. 6(a)-(d). It will be understood that clock pulses CP1, CP2 and CP3, and times T1-T7 are not necessarily the same as in the other figures. Clock pulses CP2 and CP3 are non-overlapping, active high clocks. Clock pulses CP1 and CP1B are direct inversions of each other.

Prior to clock pulses CP1, CP1B, CP2 and CP3 becoming active (high), capacitors 100, 102, 104, 106 and 108 have no stored charge. The absence of any stored charge will cause each capacitor to have a 0 V voltage drop from a node it is connected to, to the terminal receiving the respective clock pulse. For example, capacitor 104 will have an 0 V voltage drop from node 112 to node 113. This is true because node 112 is connected to and clamped to 0 V through capacitor 104 by clock pulse CP2. The voltage at node 112 will be 0 V.

After clock pulse CP2 transitions to an active state (high), the voltage at node 112 will also transition high (VCC) to maintain the voltage drop across capacitor 104 (0 V). The high voltage at node 112 turns on transistors 114 and 116 to respectively couple nodes 110 and 118 to VCC. Capacitors 100 and 106 are then charged and have a positive voltage drop from nodes 110, 118 to clock pulse terminals coupled to receive clock pulses CP1, CP3, respectively. However, these nodes to do not remain coupled to VCC long enough for the capacitors to be charged continuously to VCC. Instead, transistors 114 and 116 turned on and off by clock pulse CP2 to incrementally charge capacitors 100 and 106 through nodes 110 and 118 to VCC.

Clock pulse CP3 transitions to an active state (high) after clock pulse CP2 transitions to an inactive state (low). The voltage at node 118 will transition to a voltage greater than VCC to maintain the voltage drop across charged capacitor 106 which is greater than 0 V. Clock pulses CP2 and CP3 both pulse high and low to incrementally charge capacitors 100, 104 and 106 through nodes 110, 112 and 118. The voltages at nodes 110, 112 and 118 eventually increase past a threshold voltage $Vt_N$ as their respective capacitors are being charged. In due course, when the clock pulses respectively connected to these nodes transition active (high), the voltage at these nodes become greater than $VCC+Vt_N$. A voltage greater than $VCC+Vt_N$ applied to gate electrodes of transistors 114, 118 and 120 will allow capacitors 100, 104 and 106 to be charged to a full VCC through nodes 110, 112 and 118, respectively. This is because an n-channel transistor will turn off when the voltage at the gate electrode fails to exceed the voltage at the source electrode by at least one threshold voltage $Vt_N$. In theory, nodes 110, 112 and 118 will have a voltage of VCC when their respective clock pulses are not active (high).

With the voltage at node 118 at VCC, when clock pulse CP3 transitions to an active state (high), the voltage at node 118 will transition to 2 VCC to maintain the voltage drop across capacitor 106. 2 VCC is applied to the gate electrode of transistor 120 to turn it on. While clock pulse CP3 is active (high), clock pulse CP1 transitions to an active state (high). This causes the voltage at node 110 to rise to 2 VCC to maintain the voltage drop across capacitor 100. Capacitor 102 will only charge to $2\ VCC-Vt_N$ through node 122 because the voltage at the gate electrode of transistor 120 is 2 VCC.

The voltage 2 VCC at node 118 is also applied to the gate electrode of transistor 124 to turn it on. Since node 122 can only achieve a voltage of $2\ VCC-Vt_N$, node 126 will charge to a full $2\ VCC-Vt_N$ because the voltage at the gate electrode of transistor 124 is 2 VCC.

After clock pulse CP3 transitions to an inactive state (low), clock pulses CP1B and CP2 transition active (high). Thus, the voltages at nodes 122 and 126 are $3\ VCC-Vt_N$ to maintain the voltage drop of capacitors 102 and 108, respectively. The voltage at node 126 ($3\ VCC-Vt_N$) is applied to the gate electrode of transistor 128 to turn it on. Since the voltages at the gate and drain electrodes of transistor 128 are $3\ VCC-Vt_N$, node 130 coupled to the capacitive load CLoad designated by 131 in FIG. 5 can achieve a voltage of $3\ VCC-2\ Vt_N$.

In view of the foregoing explanation, the operation of the FIG. 5 circuit will now be explained. At a time T1 in FIG. 6(c), clock pulse CP2 transitions to an inactive state (low). After clock pulse CP2 transitions to an inactive state (low), node 112 and node 126 transition from 2 VCC to VCC and from $3\ VCC-Vt_N$ to $2\ VCC-Vt_N$, respectively. Transistors 114 and 128 are turned off and therefore node 110 is decoupled from VCC and node 122 is decoupled from node 130. Also, transistor 116 is shut off and decouples node 118 from VCC.

At a time T2 in FIG. 6(a), clock pulse CP1 transitions to an active state (high), which causes node 110 to rise to a theoretical maximum of 2 VCC since the capacitance of capacitor 100 is much greater than all other parasitic capacitances on node 110. Also, at time T2 in FIG. 6(b), a clock pulse CP1B transitions to an inactive state (low) which causes node 122 to decrease from the voltage $3\ VCC-Vt_N-\Delta V$ to $2\ VCC-Vt_N-\Delta V$. $\Delta V$ is the change in voltage at node 122 due to the pumping of current from capacitor 102 to capacitance load 131 prior to CP2 transitioning low at T1 in FIG. 6(c).

At a time T3 in FIG. 6(d), a clock pulse CP3 transitions to an active state (high) which causes node 118 to rise to a theoretical maximum of 2 VCC since capacitor 106 is larger than the gate capacitance of transistor 120 and all other parasitic capacitances on node 118. After node 118 increases to 2 VCC, transistor 130 is turned on and couples node 110 to node 122. Since the voltage at node 110 is 2 VCC and the voltage at node 122 is $2\ VCC-Vt_N-\Delta V$, charge or current is transferred from capacitor 100 to capacitor 102 until the voltage at node 110 and node 122 equalize. Also at this time, transistors 117 and 124 arc on. Through the source-drain path of a transistor 117, node 112 remains clamped at VCC. With node 112 at VCC, transistor 117 remains off. Through the source-drain path of transistor 124, node 122 and 126 are coupled together. This insures that transistor 128 is off since its gate-to-source voltage is 0 V volts.

At a time T4 in FIG. 6(d), a clock pulse CP3 transitions to an inactive state (low) which causes node 118 to fall to a theoretical minimum of VCC. After node 118 transitions to its minimum voltage, transistor 120 turns off and decouples nodes 110 and 122 from each other. Also, transistors 117 and 124 are turned off and therefore decouple node 112 from VCC and node 126 from node 122.

At a time T5 in FIG. 6(a), a clock pulse CP1 transitions to an inactive state (low), which causes node 110 to fall to a theoretical minimum $VCC-\Delta V$. $\Delta V$ is the voltage that capacitor 100 transferred to capacitor 102 after a time T3 in FIG. 6(d). Also, at this time T5 in FIG. 6(b), clock pulse CP1B transitions to an active state (high) which causes node 122 to increase to a theoretical maximum of $3\ VCC-Vt_N$. At a time T6 in FIG. 6(c), a clock pulse CP2 transitions high (active), which causes the voltage at node 126 to rise to a theoretical maximum of $3\ VCC-Vt_N$ since the capacitance of capacitor 108 is much greater than all other parasitic capacitances on that node. This turns on transistor 128 and pumps charge from capacitor 102 to capacitive load 131 through the source-drain path of transistor 70. Also at time T6, node 112 rises to 2 VCC and turns on transistor 114 to couple node 110 to VSS. Node 110 increases from $VCC-\Delta V$ to VCC through the source-drain of transistor 114.

Each cycle (time duration T7 in FIGS. 6(a)–(d)) of the clock pulses CP1, CP1B, CP2 and CP3 increases the voltage at node 130 by a voltage $\Delta V$. Since the gate electrode of transistor 126 can reach a maximum of $3\ VCC-Vt_N$, the maximum theoretical voltage that node 130 can attain is $3\ VCC-2\ Vt_N$. Thus, a dual-stage pump can pump to a higher voltage than a single-stage pump. The major disadvantage is that its efficiency decreases to 33% (theoretical best). Efficiency is roughly equivalent to $$\frac{1}{n+1}$$

where n=the number of stages. Hence, a single-stage pump is 50% efficient and a dual-stage is 33% efficient (maximum).

A p-type transistor charge pump circuit can be used to obtain 2 VCC. Yet care must be taken not to forward bias the substrate. This will latch-up the transistors. Also, the start-up of p-type transistor charge pump circuits may forward bias the substrate, again causing latch-up.

Therefore, it is a general object of this invention to overcome the above-listed problems.

Another object of the present invention is to provide a charge pump that can obtain 2 VCC and obtain an efficiency of approximately 40% (or more).

A further object of the present invention is to derive all power from VCC.

Still another object of the present invention is to avoid the use of p-type devices, therefore avoiding start-up or forward biased substrate problems.

Yet another object of the present invention is to provide a circuit that can pump only to 2 VCC—wherefore the charge pump can be used unregulated.

SUMMARY OF THE INVENTION

This invention provides a single-stage charge pump where additional circuitry eliminates the threshold voltage drop characteristic a single-stage pump in order to achieve a full 2 VCC without the attending efficiency loss of a dual-stage charge pump. A preferred embodiment of the present invention includes two charge pump circuits. A secondary charge pump circuit is used to develop 2 VCC$-$Vt$_N$ at a node. A main charge pump circuit is used to pump a capacitive load to obtain 2 VCC, for example, while maintaining an efficiency close to approximately 40%.

It will be understood that a novel and important aspect for the operation of such a charge pump is the ability to obtain 2 VCC while maintaining an efficiency close to 40% using n-type devices and deriving its power only from VCC.

Another important aspect of the operation of such a charge pump circuit is that the timing is arranged where a capacitor used to supply the pump charge is not discharged to VCC, and the capacitive load charge is not discharged to that capacitor.

According to another aspect of the invention, a charge pump for an integrated circuit has a first charge pump with a first pump input coupled to receive a power supply voltage of VCC, a first pump output, and a first transistor selectively coupling the first pump input to the first pump output so that charge from the first pump input can be transferred via the first transistor to the first pump output. Preferably a capacitor is associated with the first charge pump input. Preferably, the VCC is supplied selectively (via another transistor) to that input. The invented configuration also has an internal node which is distinct from the first pump input and which is coupled to a control electrode of the first transistor. In addition, the invented configuration has a second charge pump having a second pump input coupled to receive the power supply voltage of VCC, and a second pump output. The second pump output is coupled to the internal node for pumping it to a voltage sufficient to permit the first transistor to develop a full 2 VCC at the first charge pump output.

According to further aspects of the invented apparatus, the invention provides a primary pump having an n-channel transistor for pumping charge to the output node. A control electrode of the n-channel transistor is coupled to the output of a secondary charge pump. The secondary charge pump preferably develops a voltage above 2 VCC at that control electrode, and this permits the primary pump to pump a full 2 VCC to the output node.

A method of pumping charge in an integrated circuit charge pump using some aspects of the invention includes operating a first charge pump by coupling a supply voltage VCC to a first node, then driving the first node to 2 VCC, and turning on a first switch device to transfer the voltage on said first node to a capacitive output node. The step of turning on the first switch device includes operating a second charge pump to develop a voltage higher than 2 VCC on a control electrode of the first switch device.

A more specific method includes the steps of turning on a first transistor to couple a supply voltage VCC to a first (internal) node and then turning off the first transistor. Then, the method turns on a second transistor to pump charge from a second node to the first (internal) node so that the first node voltage rises higher than VCC, and then turning off the second switch. Thereafter, the method capacitively couples a first clock pulse transition to the first node to drive the first node voltage above 2 VCC. At some time, the method develops a voltage of about 2 VCC at a third node isolated from the first (internal) node. The method controls a third switch using the first node voltage to cause the third switch to pump a full 2 VCC from the third node to an output node. Preferably, after pumping the full 2 VCC to the output node, the method capacitively couples a second clock transition opposite in direction to the first clock pulse transition to the first node thereby to lower the voltage at said first node to a range higher than VCC but below 2 VCC. Then the method turns on the first switch to discharge the first node voltage to VCC.

BRIEF DESCRIPTION OF THE DRAWINGS

The invention, together with its objects and the advantages thereof may best be understood by reference to the following detailed description taken in conjunction with the accompanying drawings wherein.

DETAILED DESCRIPTION OF THE PREFERRED EMBODIMENT

Figure 1:
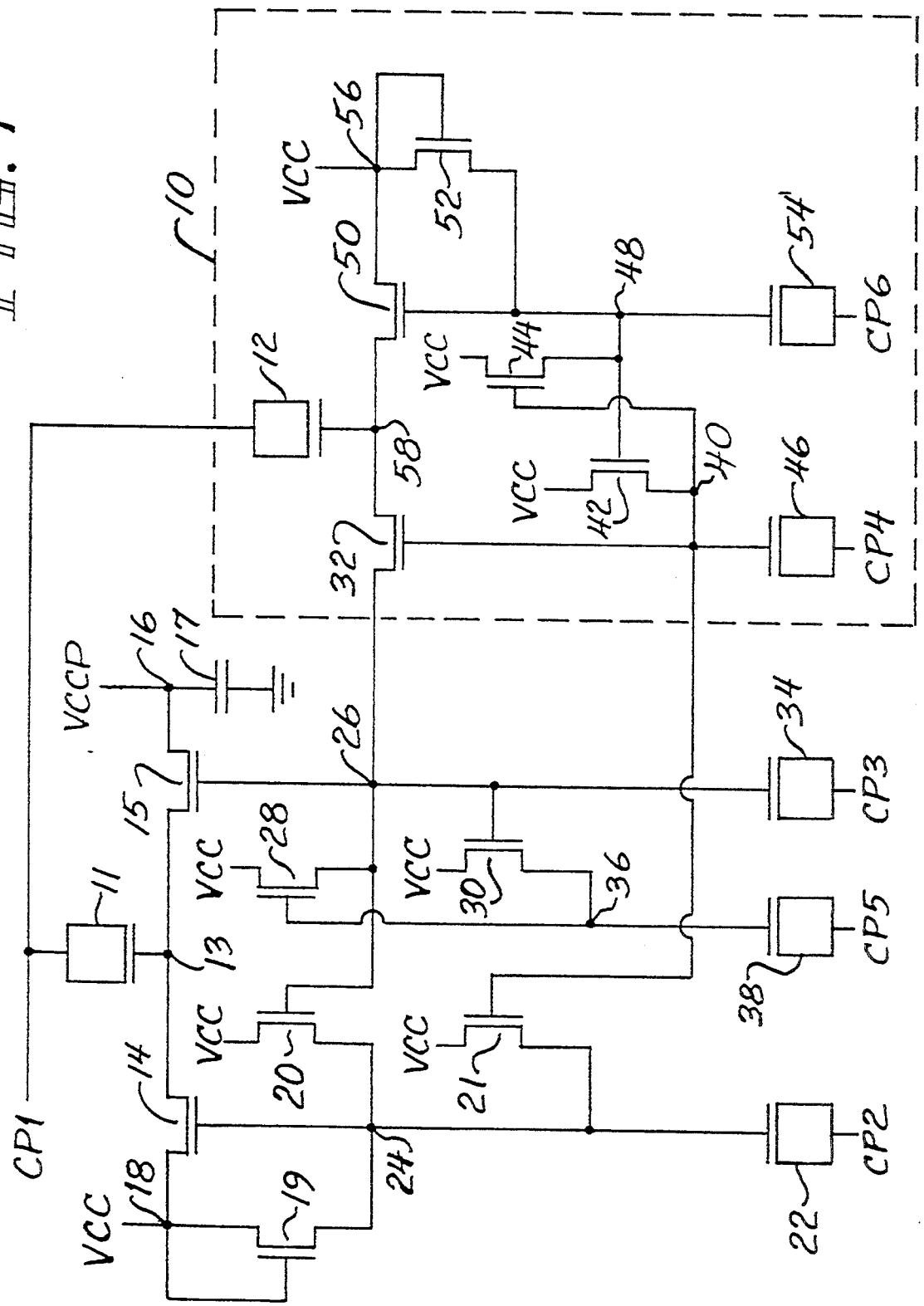
FIG. 1 is a detailed schematic diagram of a circuit embodying the present invention.
Figure 2A:
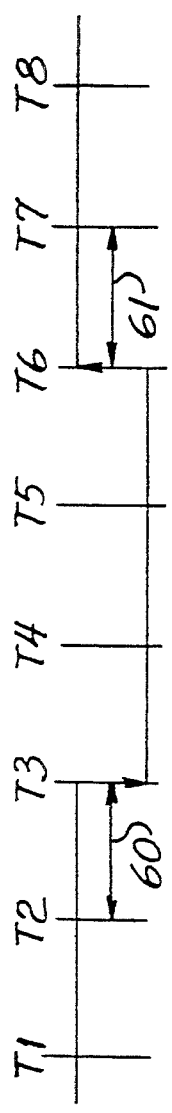
FIGS. 2(a)-(f) are timing diagrams for the FIG. 1 embodiment.
Figure 2B:
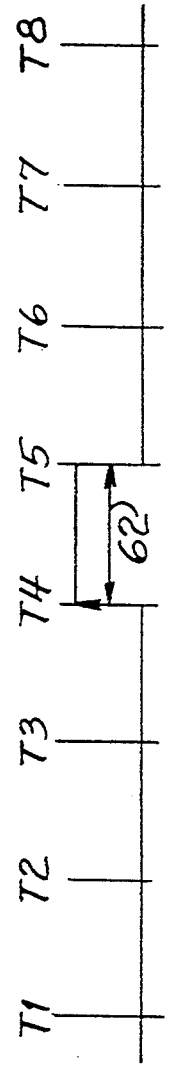
Figure 2C:
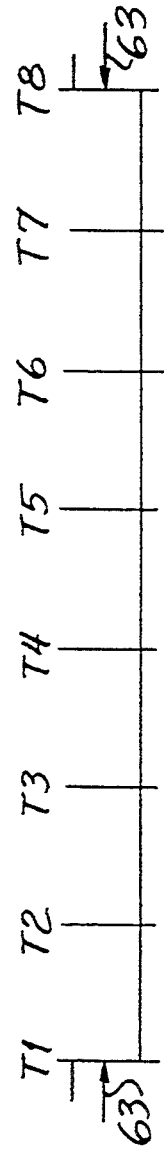
Figure 2D:
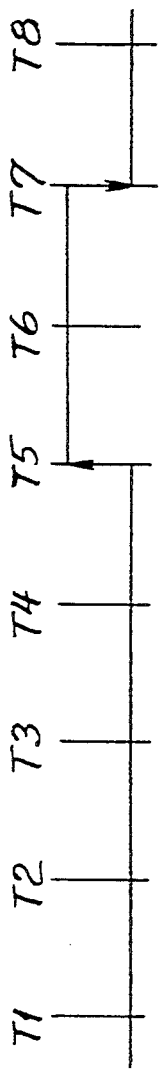
Figure 2E:
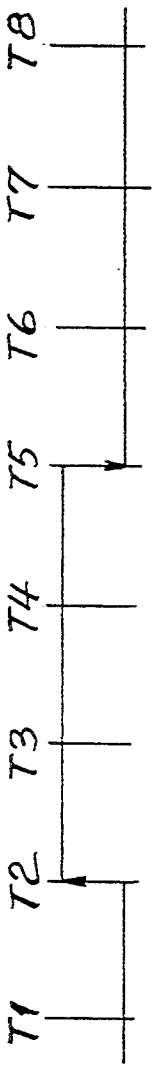
Figure 2F:
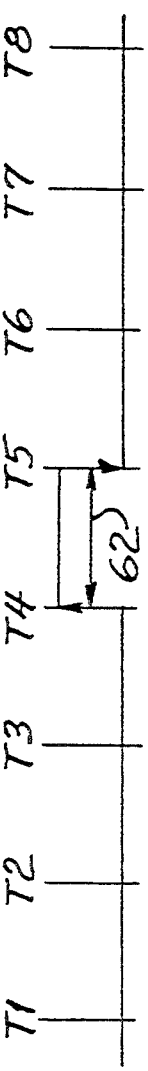
Figure 3:
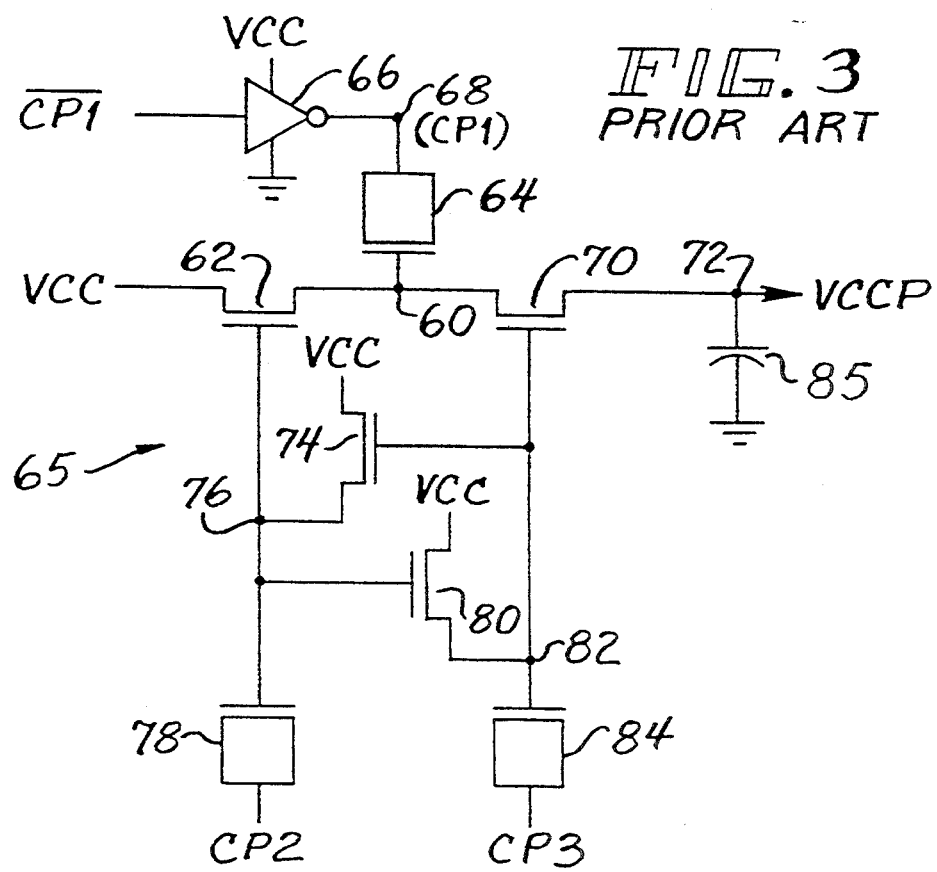
FIG. 3 is a schematic diagram of a prior art charge pump using n-channel transistors.
Figure 4A:
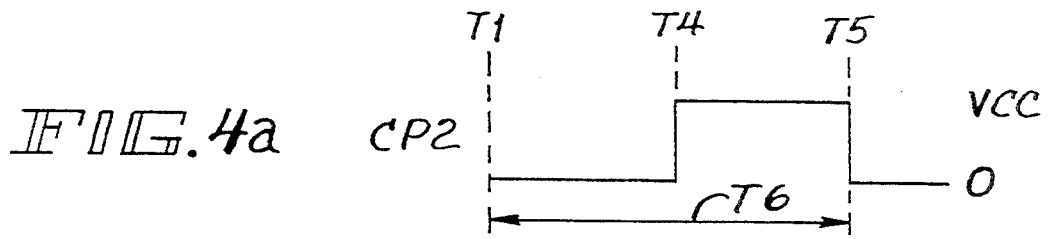
FIGS. 4(a)-(c) are timing diagrams for the FIG. 3 circuit.
Figure 4B:
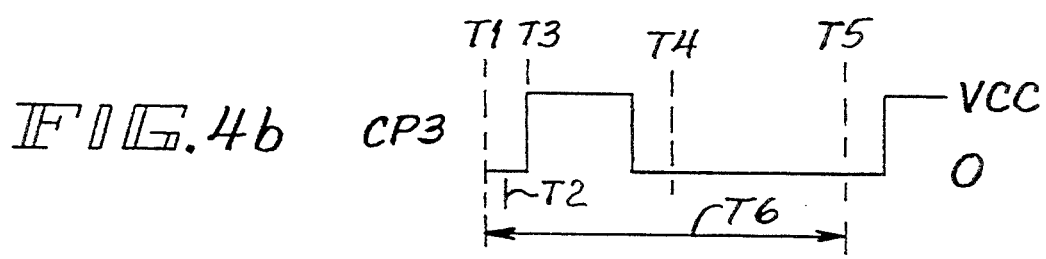
Figure 4C:
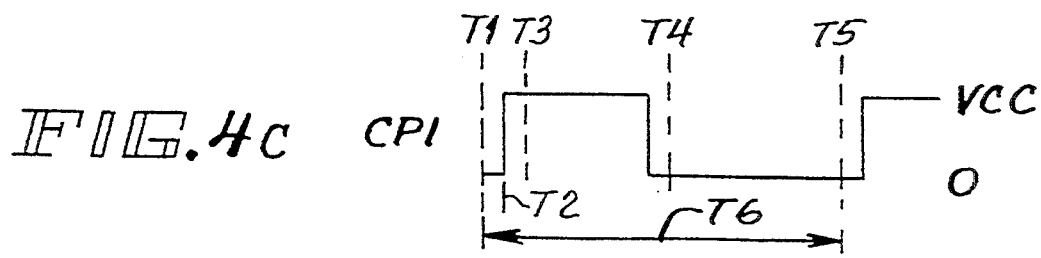
Figure 5:
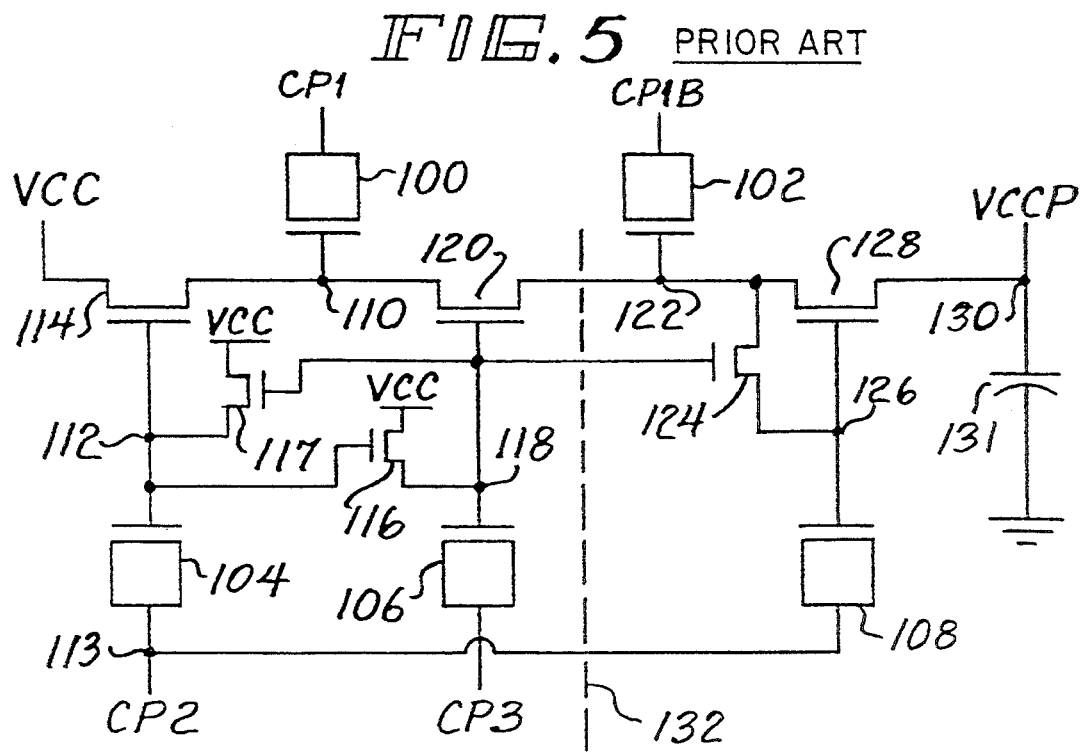
FIG. 5 is a schematic diagram of a prior art dual-stage charge pump.

FIG. 1 is a schematic diagram of the preferred circuit embodiment of the present invention. Preferably, this circuit is fabricated on an integrated circuit. All of the elements of FIG. 1 are n-channel enhancement mode devices, unless otherwise indicated. The preferred embodiment includes a secondary pump consisting of the elements shown in block 10 of FIG. 1. A main pump includes the elements shown outside of block 10. The FIG. 1 circuit is coupled to receive six clock input signals CP1 to CP6. It will be understood that clock pulses CP1, CP2 and CP3, and times T1-T7 are not necessarily the same as in the other figures. Each such clock input is applied to a corresponding capacitor, except that clock pulse CP1 is supplied to electrodes of capacitors 11 and 12. A first node 13 is coupled to another electrode of capacitor 11. Node 13 is selectively coupled to a first power supply, typically 5 volts, through a source-drain path of a transistor 14. The first power supply voltage is referred to as VCC, which may also be called a source of operating voltage. Node 13 is also selectively coupled through a source-drain path of a transistor 15 to an output node 16. Node 16 has a capacitive load CLoad designated by 17.

A second node 24 is coupled to a gate of transistor 14. Node 24 is selectively coupled to VCC through source-drain paths of any of transistors 19, 20 and 21. Node 24 is also coupled to an electrode of a capacitor 22. A gate electrode of transistor 19 is coupled to the first power supply. A clock pulse CP2 is coupled to another electrode of capacitor 22.

A third node 26 is coupled to gate electrodes of transistors 15, 20 and 30. Node 26 is selectively coupled to VCC through a source-drain path of a transistor 28. Further, node 26 is selectively coupled to a node 58 through a source-drain path of a transistor 32. Node 26 is also coupled to an electrode of capacitor 34. A clock pulse CP3 is coupled to another electrode of capacitor 34.

A fourth node 36 is coupled to a gate electrode of transistor 28. Node 36 is selectively coupled to VCC through a source-drain path of transistor 30. Node 36 is also coupled to an electrode of capacitor 38. A clock pulse CP5 is coupled to another electrode of capacitor 38. Fourth node 36 also is coupled to the gate electrode of transistor 28.

A fifth node 48 is coupled to gate electrodes of transistors 42 and 50. Node 48 is selectively coupled to VCC through source-drain paths of transistors 44 and 52. A gate electrode of transistor 52 is coupled to the first power supply. Node 48 is also coupled to an electrode of capacitor 54. A clock pulse CP6 is coupled to another electrode of capacitor 54. A source-drain path of transistor 50 selectively couples node 58 to VCC. An electrode of capacitor 12 is coupled to node 58.

A node 40 is coupled to gate electrodes of transistors 21, 32 and 44. Node 40 is selectively coupled to VCC through a source-drain path of transistor 42. Node 40 is also coupled to an electrode of capacitor 46. A clock pulse CP4 is coupled to another electrode of capacitor 46.

Capacitors 11, 12, 22, 34, 38, 46 and 54 are preferably n-channel transistors having their respective source and drain electrodes shorted together to form one electrode of the capacitor. The gate electrode is the other electrode of the capacitor.

It is intended that nodes 13, 24, 26, 36, 40, 48 and 58 follow clock pulses CP1, CP2, CP3, CP5, CP4, CP6 and CP1, respectively. Nodes 13, 24, 36, 40, 48 and 58 should operate between, for example, VCC and 2 VCC. Node 26 should operate between, for example, VCC and 3 VCC−Vt$_N$.

Operation of FIG. 1

A detailed description of the operation of the FIG. 1 embodiment will now be described with reference to FIGS. 2(a)-(f). At a time T1, clock pulse CP3 transitions from an active state (high) to an inactive state (low) which turns off transistor 15 and decouples CLoad (node 16) from node 13. At a time T2, clock pulse CP5 transitions from an inactive state (low) to an active state (high). The timing of clock pulses CP3 and CP5 insures that node 26 will not discharge positive charge through transistor 28 while clock pulses CP3 and CP5 are active. With clock pulse CP5 active, transistor 28 turns on to couple node 26 to VCC. Capacitor 34 is charged through node 26 from the power supply providing voltage VCC. After clock pulse CP5 transitions to an active state (high), a preferred time delay 60 between T2 and T3 is imposed to insure that node 26 equals VCC before clock pulse CP1 transitions to an inactive state (low) at a time a T3. This preferred delay is used to prevent transistor 15 from turning on when clock pulse CP1 transitions to an inactive state (low), which would cause pumped charge from leaking out of capacitive load 17 to node 13.

At time T3, clock pulse CP1 transitions to an inactive state (low), and nodes 13 and 58 transition from a positive voltage to a positive voltage slightly below VCC(VCC−ΔV). At a time T4, clock pulse CP2 goes to the active state (high). This causes nodes 13 and 58 to charge to VCC via transistors 14 and 50, respectively. A preferred time delay 62 is needed to insure the discharge of capacitors 11 and 12 to VCC.

At a time T5, clock pulses CP2, CP4, CP5 and CP6 change states. Clock pulses CP2 and CP6 become inactive (low) before clock pulse CP1 becomes active to prevent the further discharge of capacitors 11 and 12 to VCC by turning off transistors 14 and 50. Clock pulse CP5 becomes inactive (low) to unclamp node 26 from VCC by turning off transistor 28. Clock pulse CP4 becomes active (high) to allow a positive charging of node 26 by turning on transistor 32 before clock pulse CP1 transitions to an active state (high). It is not necessary for clock pulse CP5 to transition inactive (low) before clock pulse CP4 transitions to an active state (high) since node 26 and node 56 are both at the voltage potential VCC, and no charge transfer will occur until clock pulse CP1 transitions to an active state (high).

At a time T6, clock pulse CP1 transitions to an active state (high). Positive charge is pumped into node 26 via transistor 32 from node 58. The voltage at node 26 is determined by the following equation:

$$Vnode26 = \frac{(VCC)(C34) + (2VCC)(C12)}{C12 + C34} \quad (1)$$

where Vnode26 is the maximum theoretical pumped voltage at node 26, and C12 and C34 are the capacitive values 12 and 34, respectively.

Hence, Vnode26 can approach values of 2 VCC if the capacitance of capacitor 12 is much greater than the capacitance of capacitor 34. However, since the gate of transistor 32 reaches only 2 VCC, then the maximum voltage that node 26 can approach is 2 VCC−Vt$_N$. In actual applications, one may set the capacitance of capacitor 12 approximately equal to the capacitance of capacitor 34. Thus, the voltage on node 26 would approach 3 VCC/2. After clock pulse CP1 transitions high at a time T6, a preferred time delay 61 is used to insure that the voltage on node 26 has reached its maximum value when charge is transferred from capacitor 12 to capacitor 34.

At a time T7, clock pulse CP4 transitions to an inactive state (low) to turn transistor 32 off and decouple node 26 from node 58. This is done in preparation of clock pulse CP3 transitioning at time T8. With node 26 decoupled from node 58, the voltage on node 26 is mainly a function of the capacitance of capacitor 34 and the gate capacitance of transistor 15.

At a time T8, clock pulse CP3 transitions to an active state (high). The voltage on node 26 rises by another voltage VCC (since the capacitance of capacitor 34 is much greater than the gate capacitance of transistor 15). Hence, the voltage on node 26 is 3 VCC−Vt$_N$ or 2.5

VCC, depending on whether node 26 was initially charged to 2 VCC−Vt$_N$ or 3 VCC/2 at a time T6 (again note that this was dependent on the sizes of capacitors 34 and 12). After clock pulse CP3 transitions to an active state (high), a preferred time delay 63 is used to insure the transfer or pumping of all positive charge from capacitor 11 to CLoad.

The voltage of the drain of transistor 15 is equal to 2 VCC and the voltage of the gate of transistor 15 (also node 26) equal to 3 VCC−Vt$_N$ or 2.5 VCC. Transistor 15 will stay on while node 13 (capacitor 11) charges CLoad to a full theoretical 2 VCC because the gate voltage of transistor 15 is a threshold voltage Vt$_N$ greater than 2 VCC.

It is preferred that clock pulse CP1 transitions only when clock pulses CP2 and CP6 are inactive (low). This avoids the discharge of charged nodes 13 and 58 to power supply VCC while transistors 14 and 50 are respectively on, and the charged capacitive load coupled to pumped node 16 from discharging to power supply VCC. Clock pulses CP2 and CP3 as well as CP3 and CP6 are preferably non-overlapping when active.

The efficiency of the circuit will now be explained. A main charge pump comprises transistors 14 and 15, nodes 13, 18, 24 and 26, capacitors 11, 22 and 34, and pumped node 16. A secondary charge pump consists of transistors 32 and 50, a connection to main control node 26, nodes 40, 48, 56, and 58, and capacitors 12, 46 and 54. The efficiency of the circuit is calculated as:

$$\frac{I_{Vccp}}{I_{Vcc1} + I_{Vcc2}} \quad (2)$$

where $I_{Vccp}$ is the current of the capacitive load charged to VCCP, $I_{Vcc1}$ is the power supply VCC current of the charge pump and $I_{Vcc2}$ is the power supply VCC current of the secondary charge pump. Since a single-stage charge pump has a theoretical efficiency of 50%, $I_{Vcc1} = 2\ I_{VccP}$ and $I_{Vcc2} = 2\ I_{Vnode\ 26}$. If the main and secondary charge pumps are the same size (i.e. the transistors are the same size) then $I_{Vccp} = I_{Vnode\ 26}$ and the efficiency calculated by equation 1 is 25%. Since the critical node charge pump is pumping only critical node 26, it does not have to be as large as the main charge pump. It is preferred that the critical node charge pump provide $I_{Vnode26} = 0.25\ I_{Vccp}$. The efficiency of the FIG. 1 embodiment is approximately 40% when using the Equation 2 and ignoring parasitic values.

Figure 7:
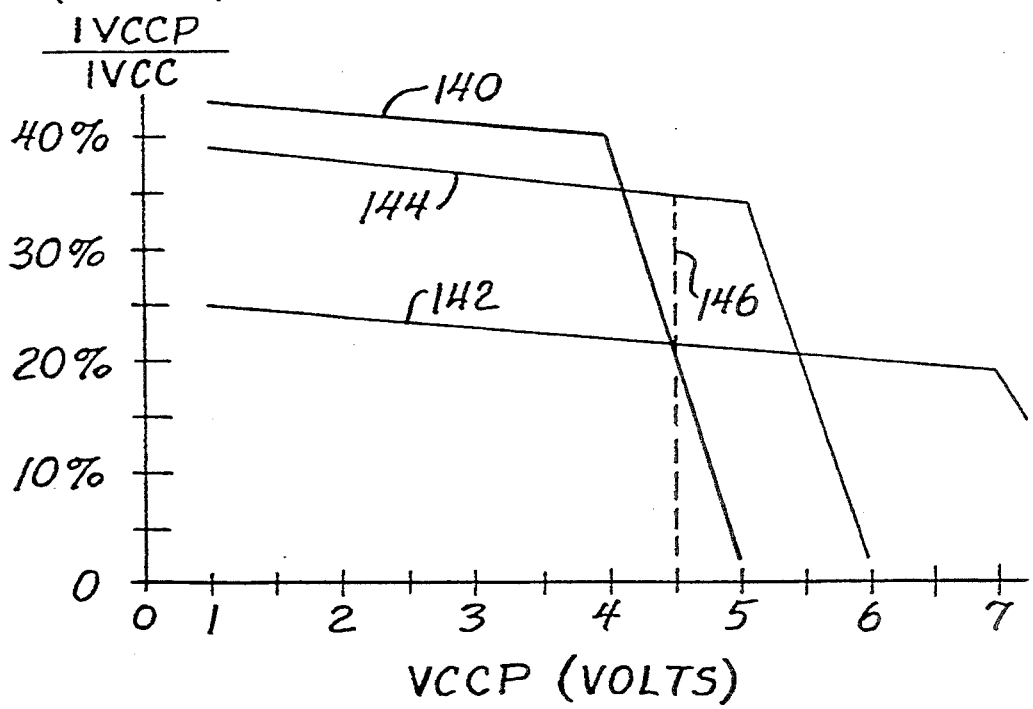
FIG. 7 is a graph of the efficiencies of the single- and dual-stage pumps, and the pump of the present invention.
Figure 6A:
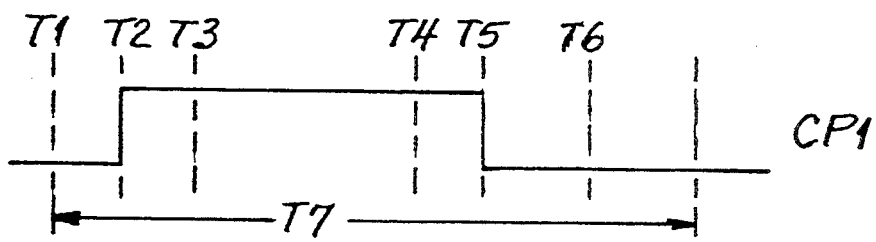
FIGS. 6(a)-(d) are timing diagrams for the dual-stage pump of FIG. 5.
Figure 6B:
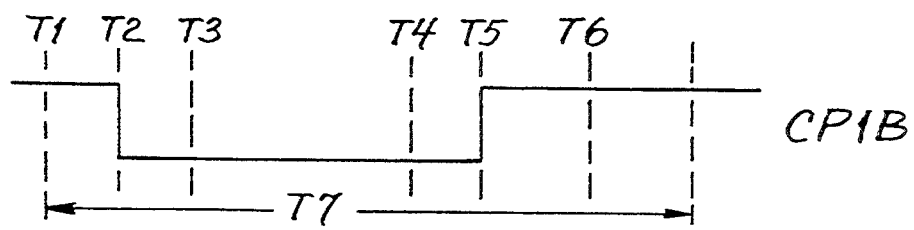
Figure 6C:
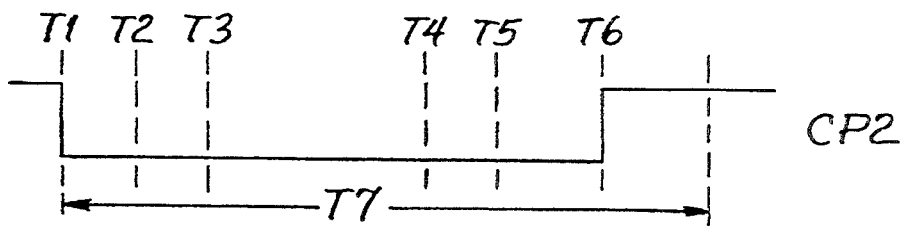
Figure 6D:
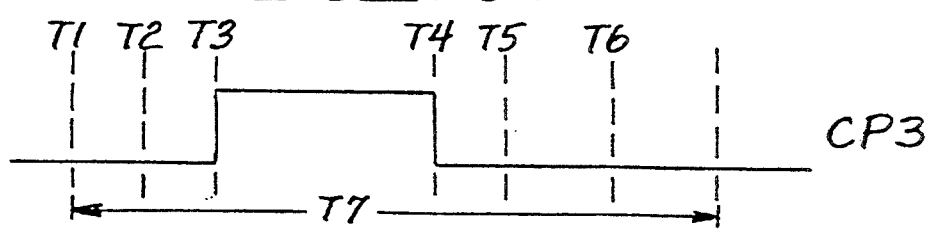

A comparison of the efficiencies of the single-stage pump, dual-stage pump and the pump of the present embodiment can be seen in FIG. 7. Line 140 represents the efficiency of the single-stage pump. Line 142 represents the efficiency of the dual-stage pump. Line 144 represents the efficiency of the preferred embodiment of the present invention.

If the voltage of VCCP were desired to be, for example, 4.5 V, (VCC=3 V), then the efficiency of the preferred embodiment pump would not only exceed the efficiency of the dual-stage pump, but also the single-stage pump. In FIG. 7, line 146 represents VCCP=4.5 V."; and where line 146 intersects lines 140, 144 and 142 represents the respective efficiencies of the single-stage pump, the preferred embodiment pump and the dual-stage pump.

The FIG. 1 embodiment provides a full 2 VCC. This would allow the preferred embodiment to be used unregulated in some applications requiring a full 2 VCC.

Any variation in voltage supply VCC, down to 2 V, will still enable main control node 26 to achieve a voltage that is a threshold voltage Vt$_N$ greater than 2 VCC. It follows that the preferred embodiment of the present invention can have a supply voltage VCC as low as 2 V. Further, since the device can operate at voltages as low as 2 V, it will also operate with greater voltages and therefore tolerate a wider voltage range for the power supply VCC.

One skilled in the art should recognize that the secondary charge pump can be replaced by other devices (circuits) which charge node 26 to a voltage Vt$_N$ greater than VCCP without departing from the spirit of the present invention.

One skilled in the art should appreciate that capacitors 11, 12, 22, 34, 38, 46 and 54 are transistors with their source and drain electrodes connected together. Clock pulses CP1-CP6 are preferably coupled to the source and drain electrodes connected together. The gate electrodes of these transistors are coupled to their respective nodes in the preferred embodiment. The present invention is not limited to using transistors as capacitors and may be replaced by other elements that have a capacitive function. Also, other types of transistors can be used, including bipolar ones.

It is preferred that transistors 14 and 15 be larger (greater channel width to length ratio) than transistors 32 and 50. Such an arrangement is allowed because transistors 32 and 50 are pumping only main control node 26, and therefore require less current passing capabilities compared to transistors 14 and 15. Transistors 16 and 52 can be equivalent in size to each other. Transistors 20, 21, 28 and 30 may be larger than transistors 42 and 44. Transistor 28 may be larger than transistors 20, 21 and 30 to quickly discharge node 26 to VCC. Otherwise, transistor 28 should be turned on for a sufficient time to fully discharge node 26 to VCC. Also, capacitor 12 can be smaller than capacitor 11 since capacitor 12 is providing charge only to node 26.

It will be appreciated that the foregoing description is directed to a preferred embodiment of the present invention, and that numerous modifications or alterations can be made without departing from the spirit or scope of the present invention.

What is claimed as the invention is:

1. A charge pump for an integrated circuit comprising:
   a secondary charge pump coupled to a first node;
   a first transistor having a gate electrode, a source electrode and a drain electrode, wherein said gate electrode is coupled to said first node, said source electrode is coupled to a pumped node, and said drain electrode is coupled to a second node;
   a second transistor having a gate electrode, a source electrode and a drain electrode, wherein said source electrode is coupled to said second node, said drain electrode is coupled to a first voltage supply, and said gate electrode is coupled to a third node;
   a third transistor having a gate electrode, a source electrode and drain electrode, wherein said drain electrode and gate electrode are coupled to said first voltage supply, and said source electrode is coupled to said third node;
   a fourth transistor having a gate electrode, a source electrode and a drain electrode, wherein said drain electrode is coupled to said first voltage supply, said source electrode is coupled to said third node, and said gate electrode is coupled to said first node;
a fifth transistor having a gate electrode, a source electrode and a drain electrode, wherein said drain electrode is coupled to said first voltage supply, said source electrode is coupled to said first node, and said gate electrode is coupled to a fourth node;
a sixth transistor having a gate electrode, a source electrode and a drain electrode, wherein said drain electrode is coupled to said first voltage supply, said source electrode is coupled to said fourth node, and said gate electrode is coupled to said first node; and
a plurality of capacitors coupling respective clock signals to said first, second, third and fourth nodes.

2. A device according to claim 1 further comprising:
a seventh transistor having a gate electrode, a source electrode and a drain electrode, wherein said drain electrode is coupled to said first voltage supply, said source electrode is coupled to said third node, and said gate electrode is coupled to a fifth node; and
another capacitor coupling said fifth node to a corresponding clock signal.

3. A device of claim 2 wherein each of said capacitors comprises a transistor having its source and drain electrodes coupled together to form one capacitor terminal and having the transistor gate electrode as another capacitor terminal; and
wherein said first, second, third, fourth, fifth, sixth and seventh transistors and said plurality of capacitors are N-type devices, said plurality of capacitors being transistor-like devices, each having its respective source and drain electrodes connected together to constitute one capacitor electrode, the gate electrode being the other capacitor electrode.

4. A device according to claim 1 wherein said secondary charge pump is an N-type single-stage charge pump.

5. A charge pump for an integrated circuit comprising:
a first transistor having a gate electrode, a source electrode and a drain electrode, wherein said gate electrode is coupled to a first node, said source electrode is coupled to a pumped node, and said drain electrode is coupled to a second node;
a second transistor having a gate electrode, a source electrode and a drain electrode, wherein said drain electrode is coupled to a first voltage supply, said gate electrode is coupled to a third node, and said source electrode is coupled to said second node;
a third transistor having a gate electrode, a source electrode and a drain electrode, wherein said drain electrode and gate electrode are coupled to said first voltage supply, and said source electrode is coupled to said third node;
a fourth transistor having a gate electrode, a source electrode and a drain electrode, wherein said drain electrode is coupled to said first voltage supply, said source electrode is coupled to said third node, and said gate electrode is coupled to said first node;
a fifth transistor having a gate electrode, a source electrode and a drain electrode, wherein said drain electrode is coupled to said first voltage supply, said source electrode is coupled to said first node, and said gate electrode is coupled to a fourth node;
a sixth transistor having a gate electrode, a source electrode and a drain electrode, wherein said drain electrode is coupled to said first voltage supply, said source electrode is coupled to said third node, and said gate electrode is coupled to a fifth node;
a seventh transistor having a gate electrode, a source electrode and a drain electrode, wherein said drain electrode is coupled to said first voltage supply, said source electrode is coupled to said fourth node, and said gate electrode is coupled to said first node;
an eighth transistor having a gate electrode, a source electrode and a drain electrode, wherein said source electrode is coupled to said first node, said drain electrode is coupled to a sixth node, and said gate electrode is coupled to said fifth node;
a ninth transistor having a gate electrode, a source electrode and a drain electrode, wherein said drain electrode is coupled to said first voltage supply, said source electrode is coupled to said fifth node, and said gate electrode is coupled to a seventh node;
a tenth transistor having a gate electrode, a source electrode and a drain electrode, wherein said drain electrode is coupled to said first voltage supply, said source electrode is coupled to said seventh node, and said gate electrode is coupled to said fifth node;
an eleventh transistor having a gate electrode, a source electrode and a drain electrode, wherein said drain electrode and said gate electrode are coupled to said first voltage supply, and said source electrode is coupled to said seventh node;
a twelfth transistor having a gate electrode, a source electrode and a drain electrode, wherein said source electrode is coupled to said sixth node, said drain electrode is coupled to said first voltage supply, and said gate electrode is coupled to said seventh node;
a plurality of capacitors coupling respective clock signals to said first, second, third, fourth, fifth, sixth and seventh nodes.

6. The device of claim 5 wherein each of said capacitors comprises a transistor having its source and drain electrodes coupled together to form one capacitor terminal and having the transistor gate electrode as another capacitor terminal; and
wherein said first, second, third fourth, fifth, sixth, seventh, eighth, ninth, tenth, eleventh and twelfth transistors, and said plurality of capacitors are N-type devices, said plurality of capacitors being transistor-like devices, each having its respective source and drain electrodes connected together to constitute one capacitor electrode, the gate electrode being the other capacitor electrode.

7. The device of claim 5 wherein said first and second transistors are larger than said eighth and twelfth transistors.

8. The device of claim 5 wherein said capacitor coupled to said second node is larger than said capacitor coupled to said sixth node.

9. A charge pump for an integrated circuit comprising:
a first charge pump including a first transistor having a gate electrode, a first electrode and a second electrode, wherein said gate electrode is coupled to a first node, said first electrode is coupled to a capacitive load, and said second electrode is coupled to a second node,
wherein said second node is connected to receive a first clock signal via a first capacitor;

a second transistor having a gate electrode coupled to a third node, the second transistor selectively coupling a supply voltage VCC to said second node, whereby said second node can receive VCC and then be boosted to 2 VCC by a transition in said first clock pulse;

a first voltage generation circuit for developing a voltage higher than 2 VCC at said first node, including a third transistor for selectively coupling VCC to the first node, a second charge pump for pumping charge to said first node to elevate the voltage thereof above VCC, and a second capacitor coupling a second clock signal to said first node for boosting said first node voltage to above 2 VCC, whereby the first transistor can couple a full 2 VCC from the second node to the capacitive load; and a second voltage generation circuit for developing a voltage of 2 VCC at said third node, including a fourth transistor for selectively Coupling VCC to said third node and a third capacitor for coupling a third clock signal to said third node go that said third node voltage may be boosted.

10. A charge pump for an integrated circuit comprising:

a first charge pump having first charge pump output, a first charge pump input, and an internal node distinct from said first charge pump input; and a second charge pump having a second charge pump input and a second charge pump output, said second charge pump output being coupled to said internal node for pumping said internal node to a high voltage, said first charge pump receiving a power supply of VCC at said first charge pump input, said second charge pump also receiving a power supply of VCC at said second charge pump input;

wherein said first charge pump includes first and second transistors having a first node coupled between them, wherein said first node is coupled to receive a first clock signal, wherein said first transistor is coupled to said first charge pump input, wherein said second transistor is coupled to said first charge pump output, and wherein said internal node is coupled to a control electrode of said second transistor;

whereby said first charge pump is able to pump said first charge pump output to a full 2 VCC.

11. The charge pump of claim 10 wherein the second charge pump is smaller in size than the first charge pump, so that said charge pump has a relatively high efficiency.

12. A charge pump for an integrated circuit comprising:

a first charge pump having first pump input coupled to receive a power supply voltage of VCC, a first pump output, and a first transistor selectively coupling said first pump input to said first pump output, so that charge from the first pump input can be transferred via the first transistor to the first pump output;

an internal node, distinct from said first pump input and coupled to a control electrode of said first transistor; and a second charge pump having a second pump input coupled to receive said power supply voltage of VCC, and a second pump output, said second pump output being coupled to said internal node for pumping said internal node to a voltage sufficient to permit said first transistor to develop a full 2 VCC at said first charge pump output.

13. The charge pump of claim 12 wherein the second charge pump is smaller in size than the first charge pump, so that said integrated circuit charge pump has a relatively high efficiency.

14. The charge pump of claim 12 wherein the first charge pump includes a first capacitor having a first electrode coupled to receive a clock signal and a second electrode coupled to said first pump input.

15. The charge pump of claim 12 wherein the first charge pump includes a first capacitor and the second charge pump includes second and third capacitors, said second and third capacitors having respective electrodes coupled to receive clock signals, another electrode of the second capacitor being coupled to said internal node;

another electrode of the third capacitor being coupled to receive VCC via said second pump input; and a second transistor selectively coupling second pump input to said internal node so that when said second transistor is conductive, charge from the second pump input can be transferred to the internal node.

16. The charge pump of claim 15 wherein said charge pump includes a third transistor selectively coupling said internal node to VCC.

17. The charge pump of claim 16 wherein said second transistor includes a control electrode, and wherein said second charge pump further includes a fourth capacitor having one electrode coupled to said second transistor control electrode and another electrode coupled to receive a clock signal.

18. The charge pump of claim 12 wherein the first charge pump includes:

a first input transistor selectively coupling said VCC supply voltage to a first node, and a first capacitor coupling a first clock signal to said first node, said first node being coupled to said first transistor;

a second capacitor coupling a second clock signal to said second node;

wherein said second charge pump includes a second transistor selectively coupling a second node to a third node, said second node being said internal node;

a second input transistor selectively coupling said VCC supply voltage to said third node;

a third capacitor coupling a third clock signal to said third node; and said second transistor having a control electrode responsively coupled to a fourth clock signal;

wherein the charge pump further includes a third transistor selectively coupling said second node to VCC;

whereby said first charge pump develops voltage at said first node and said second charge pump develops a voltage on said internal node sufficiently higher than 2 VCC so that said first transistor in the first charge pump will couple a full 2 VCC from the first node to the first pump output.

19. The charge pump of claim 18 wherein said third clock signal is said first clock signal.

20. The charge pump of claim 12 wherein at least one of said charge pumps is a single stage pump.

21. The charge pump of claim 12 wherein both of said charge pumps are single stage pumps.

22. The charge pump of claim 12 wherein the first charge pump includes a first capacitor coupled so that the first transistor is connected to transfer charge from the first capacitor to an output node associated with a load capacitance at the first pump output;

wherein the second charge pump includes a second capacitor coupled selectively by a second transistor to the internal node; and wherein the charge pump includes a third capacitor connected to the internal node.

23. The charge pump of claim 12 wherein said second charge pump is coupled to receive a plurality of clock signals.

24. The charge pump of claim 12 wherein said first charge pump includes a plurality of first charge pump clock input nodes coupled to receive respective clock input signals, wherein one of said first charge pump clock input nodes is coupled to said internal node.

25. The charge pump of claim 24 wherein said second charge pump is coupled to receive a plurality of clock signals at second charge pump clock input nodes;

wherein one of said clock signals applied to said first Charge pump is also applied to said second charge pump.

26. A method of pumping charge in an integrated circuit charge pump comprising the steps of:

turning on a first switch to couple a supply voltage VCC to a first node; then turning off the first switch;

turning on a second switch to pump charge from a second node to said first node so that the first node voltage rises higher than VCC; then turning off the second switch; then capacitively coupling a first clock pulse transition to the first node to drive the first node voltage above 2 VCC; and developing a voltage of about 2 VCC at a third node isolated from the first node; and controlling a third switch using the first node voltage to cause the third switch to pump a full 2 VCC from the third node to an output node.

27. The method of claim 26 further comprising the steps of:

after pumping the full 2 VCC to the output node, capacitively coupling a second clock transition opposite in direction to the first clock pulse transition to the first node thereby to lower the voltage at said first node to a range higher than VCC but below 2 VCC; then turning on the first switch to discharge the first node voltage to VCC.

28. A method of pumping charge in an integrated circuit charge pump comprising the steps of:

operating a first charge pump by coupling a supply voltage VCC to a first node, then driving said first node to 2 VCC, and turning on a first switch device to transfer the voltage on said first node to a capacitive output node;

wherein said step of turning on the first switch device includes a further step of operating a second charge pump to develop a voltage higher than 2 VCC on a control electrode of the first switch device.

29. A method of chaise pumping in an integrated circuit to develop a high voltage comprising the steps of:

operating first and second charge pumps, each having a respective output node, without cascading the pumps, so that current at the second pump output node is not transferred or pumped to the first pump output node, operating the first charge pump by pumping charge from a first capacitor to an output node having an associated load capacitance, operating the second charge pump by pumping charge from a second capacitor to an internal node, to develop a voltage higher at the internal node than a voltage developed at said first capacitor, the internal node having a third capacitance associated therewith, wherein the step of operating the first charge pump further includes using the high voltage developed on the internal node as a control signal in the pumping of charge from the first capacitor to the output node.

* * * * *